United States Patent [19]

Liukkonen et al.

[11] Patent Number: 4,552,366

[45] Date of Patent: Nov. 12, 1985

[54] METHOD FOR PRODUCING A SEAL STRIP FOR A CRACK BETWEEN TWO COMPONENTS MOVING IN RELATION TO ONE ANOTHER

[76] Inventors: Vesa Liukkonen; Mika Liukkonen, both of Vehmarontie 4 as 61, 20540 Turku 54, Finland

[21] Appl. No.: 485,168

[22] Filed: Apr. 15, 1983

[51] Int. Cl.[4] ........................ B29F 3/10; B32B 3/00; H05K 9/00

[52] U.S. Cl. ........................ 277/1; 49/477; 156/244.11; 156/244.13; 264/177 R

[58] Field of Search ............... 277/1, 235, 235 B, 1 C; 49/475, 477, 497, 498; 254/504, 514, 515, 177 R; 156/244.11, 244.13

[56] References Cited

U.S. PATENT DOCUMENTS

| | | | |
|---|---|---|---|
| 2,062,305 | 12/1936 | Gillette | 277/1 |
| 2,605,202 | 7/1952 | Reynolds | 156/244.13 |
| 3,088,166 | 5/1963 | Colombo | 264/177 R |
| 3,142,865 | 8/1964 | Richie et al. | 264/177 R |
| 3,161,279 | 12/1964 | Sanders | 49/477 |
| 3,560,602 | 2/1971 | Marzolf et al. | 264/564 |
| 3,694,962 | 10/1972 | McDonald et al. | 49/477 |
| 3,812,230 | 5/1974 | Takahashi | 264/177 R |
| 4,081,504 | 3/1978 | Wenrick et al. | 264/177 R |
| 4,284,479 | 8/1981 | Schulte | 277/1 |
| 4,399,317 | 8/1983 | Van Dyk | 49/477 |
| 4,417,936 | 11/1983 | Gaffney | 156/244.13 |
| 4,423,106 | 12/1983 | Mahn | 156/244.11 |
| 4,428,593 | 1/1984 | Pearistein | 277/1 |

*Primary Examiner*—Robert I. Smith

*Attorney, Agent, or Firm*—Karl F. Ross; Herbert Dubno

[57] ABSTRACT

The invention concerns a method for producing a tubular seal for a joint between two parts, both movable in relation to one another. In the method according to this invention, the tubular seal is formed at the same time as it is being laid by squeezing from a nozzle, so that the squeezing nozzle provides the final flexible form for the seal, and the seal strip adheres to its underlying surface by its freshly adhesive surface.

3 Claims, 2 Drawing Figures

METHOD FOR PRODUCING A SEAL STRIP FOR A CRACK BETWEEN TWO COMPONENTS MOVING IN RELATION TO ONE ANOTHER

FIELD OF THE INVENTION

The present invention relates to a method for producing a seal strip for a joint between two components moving in relation to one another.

BACKGROUND OF THE INVENTION

The normal way to seal a window, door or the like, is to use a seal strip which is glued, riveted or fixed by the aid of a groove to one of the surfaces being sealed.

A good seal strip must to some extent be flexible, so that it will seal the joints even when the casement and the frame move in relation to each other due to dampness or temperature changes among other things.

Due to this the best seals have been different flanged strips, tube strips, and spongy seal strips. Up to now the strips have as a rule been factory made, and then fixed to the objects in various ways. The fixing of a seal strip to the underlying surface, especially when using the tube strips, when the aim is to separate the air in the tube from the air outside, has turned out to be a difficult operation.

Even with ordinary flanged strips, there are difficulties with fastening, as right angled turns have to be made in corners, and hinges as well as locking devices have to be circumvented.

There is also a method used, in which the sealing compound is squeezed on to one surface of window and the other surface is covered with tape, and when this has been done, the window is closed, and the compound is compressed between the sealing surfaces and sets into the mold formed thereby.

The method involves a great deal of labor, because firstly one surface of the seal must be taped and secondly the superfluous compound must be cut away after setting, and the tape must be removed.

Also because the sealed joint "lives", the seal will not be tight, because it can not expand from its set form.

SUMMARY OF THE INVENTION

The present invention obviates the above mentioned disadvantages. The teaching of the invention is a method to produce a seal between two components moving in relation to one another, such as for instance between a door or a window and its corresponding frame, by squeezing the seal as a stiff compound directly on to a underlying surface, on to which the seal is fixed by the adhesive surface of the compound, the final form of the seal being made by the configuration of the nozzle of the squirt gun, solidifying or setting after applied.

When using tube type seal strips the pressure conducted into the tube keeps the strip from collapsing as the compound congeals, and when the sealing compound has set, the end of the tube strip is sealed by closing the tube with the sealing compound. With this invention seal strips are quickly laid, without joining of the ends, without premeasuring, without gluing, and with no flanging for possible fixing in grooves or riveting. The seal strip is from end to end a complete tubular band, and the necessary anglings and possible circumventions of hinges and locking devices are easily made.

BRIEF DESCRIPTION OF THE DRAWING

The above and other objects, features and advantages of the invention will become more readily apparent from the following description, reference being made to the accompanying drawing, in which.

SPECIFIC DESCRIPTION

Figure 1:
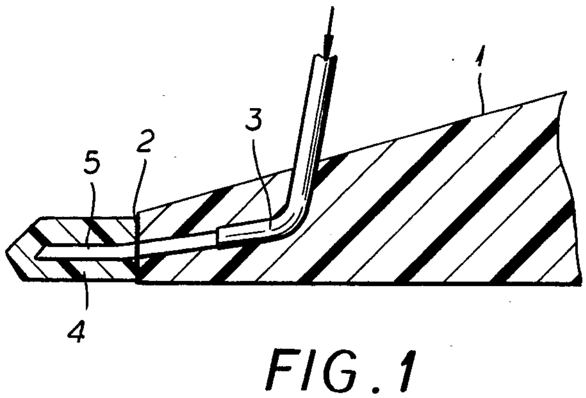
FIG. 1 is a cross sectional view of the nozzle and the tubular stand formed thereby according to the invention.

Close to the mouth 2 of the nozzle 1, a tube 3 has been provided, which makes the hole 5 in the forming tubular strip 4.

Figure 2:
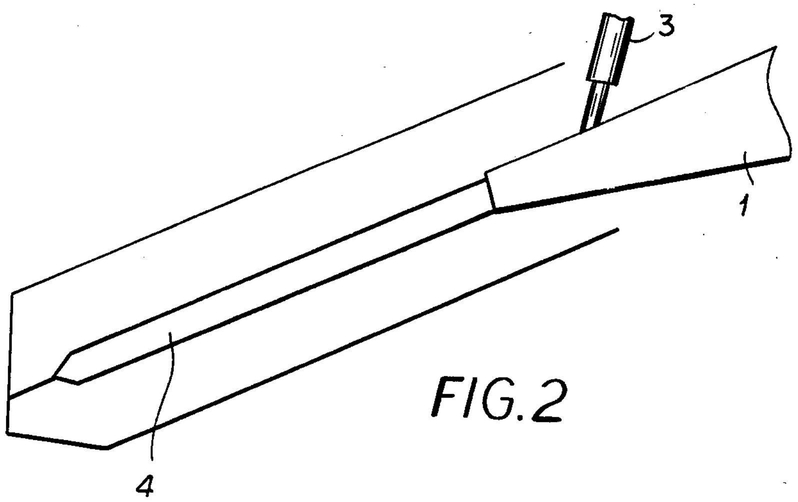
FIG. 2 is a plan view of the tubular seal strip being applied along a joint.

The hole 5 can be kept open by a small overpressure conducted through tube 3 to the strip hole 5. When starting to lay the seal strip 4, one begins with closing hole 5 at the beginning of strip 4. After this new strip is squeezed out, at the same time air is fed into the strip, and the nozzle is passed along the surfaces to be sealed in such a way, that the squeezed out strip is laid in the manner desired (FIG. 2). The raw material for the sealing strip may be for instance silicone, which hardens upon leaving a container or PVC, which has to be heated before passing through the nozzle, and which will harden quickly after cooling.

In the strip laying device a speed regulating synchronizer may also be used in order to ensure an even thickness of the strip.

We claim:

1. A method of sealing a joint, which comprises the steps of:

squeezing a flowable tubular bead of a settable material along said joint from a nozzle having a configuration whereby a hole remains in said bead running the length thereof after said bead has been deposited at, and adhered to, said joint; and setting said bead to a flexible strip retaining said hole therein.

2. The method defined in claim 1 further comprising the step of sealing the ends of said hole with said material.

3. The method defined in claim 1 wherein said hole is held open until setting of said material by introducing air therein.

* * * * *